United States Patent
Bergsma et al.

(10) Patent No.: US 7,911,283 B1
(45) Date of Patent: Mar. 22, 2011

(54) LOW NOISE OSCILLATOR AND METHOD

(75) Inventors: Adrian J. Bergsma, Kanata (CA); Charles Nicholls, Nepean (CA)

(73) Assignee: Nortel Networks Limited, Mississauga, Ontario (CA)

( * ) Notice: Subject to any disclaimer, the term of this patent is extended or adjusted under 35 U.S.C. 154(b) by 421 days.

(21) Appl. No.: 12/006,285

(22) Filed: Dec. 31, 2007

(51) Int. Cl.
*H03B 1/00* (2006.01)

(52) U.S. Cl. .......... 331/74; 331/175; 332/109; 332/106; 332/108; 332/115; 327/36; 327/37

(58) Field of Classification Search .................... 331/74, 331/175; 332/109, 115, 106, 108; 327/36, 327/37
See application file for complete search history.

(56) References Cited

U.S. PATENT DOCUMENTS 5,834,979 A * 11/1998 Yatsuka ........................ 331/1 R

* cited by examiner

*Primary Examiner* — Arnold Kinkead
(74) *Attorney, Agent, or Firm* — Robert D. McCutcheon

(57) ABSTRACT

A low noise oscillator includes a resonator 102 that is excited with a pulsed signal (i.e., an impulse of energy) to replace energy lost to parasitic resistive losses once every Nth period (where N=1, 2, 3 . . . ). The resonating signal is monitored by a level detector and when the signal falls below a predetermined threshold, the pulse generator outputs a pulse or adjusts pulse width, pulse amplitude (or both) of a pulsed signal to create the necessary impulse for application to the resonator to recoup losses resulting from resonator operation. A phase shifting circuit may be provided to ensure the pulses are time aligned with the resonating signal to reduce noise.

25 Claims, 4 Drawing Sheets

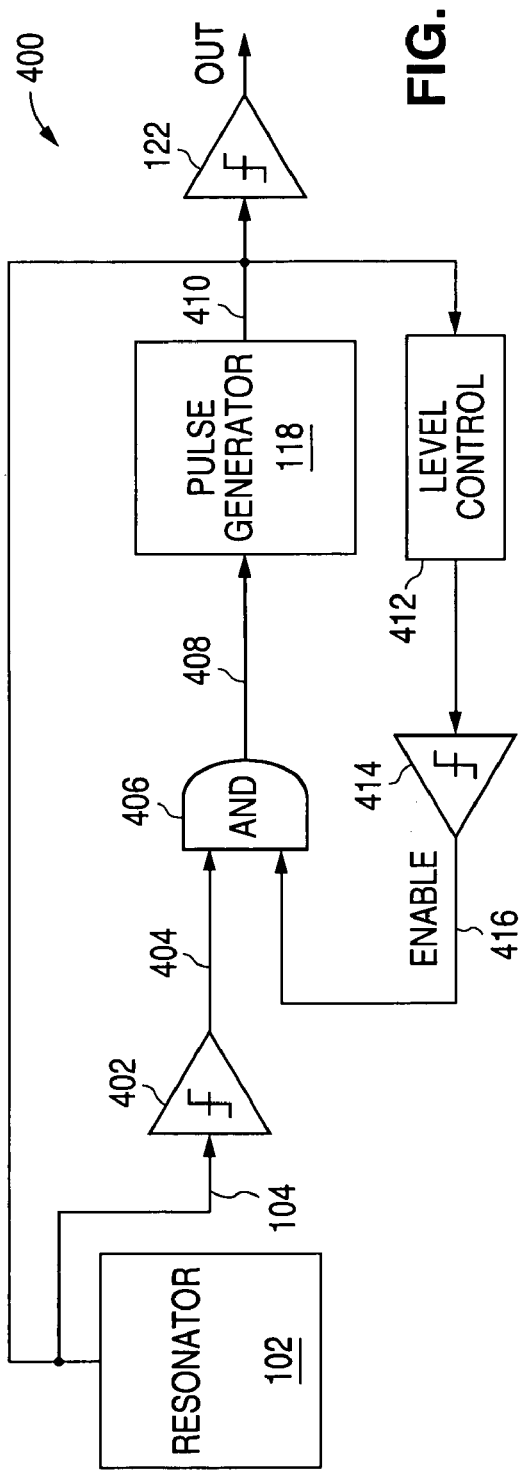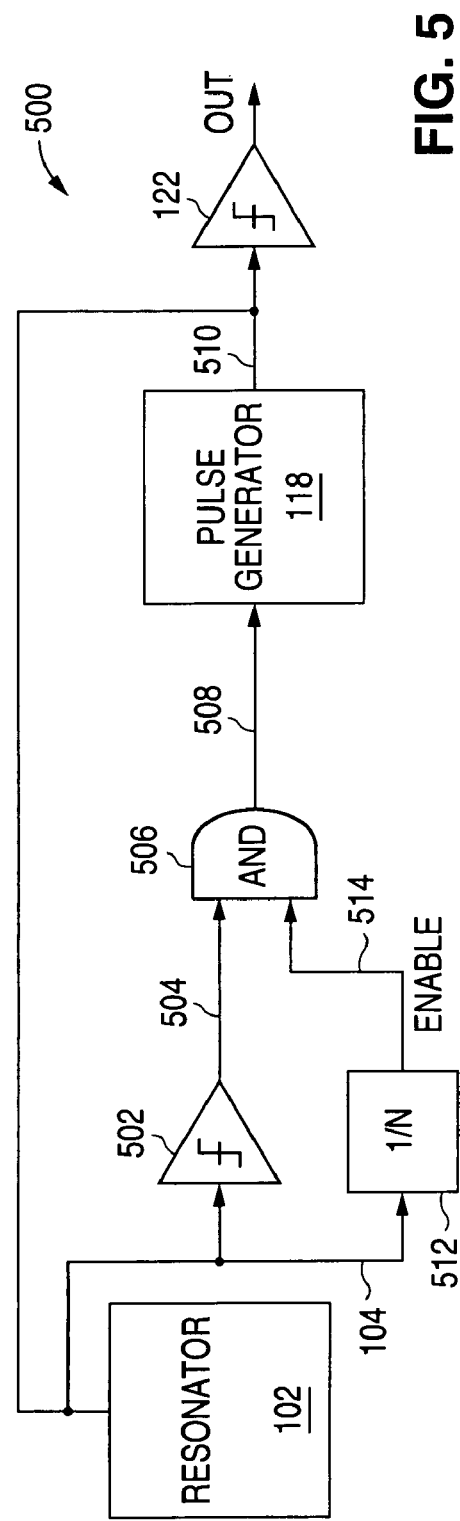

LOW NOISE OSCILLATOR AND METHOD

TECHNICAL FIELD

The present invention relates generally to oscillators, and more particularly to a low noise oscillator circuit.

BACKGROUND

An oscillator is an electronic circuit that produces a repetitive electrical signal. Most often the shape of the oscillation signal is a sine or square wave (or sawtooth, triangle, etc.).

Generally, the loop gain of an oscillator is designed to a level to ensure start up and maintain oscillation. The excess loop gain is usually controlled by distortion elements in the oscillation circuit. These elements generate additional noise conversion products resulting in an unwanted increase in noise (phase) within the oscillator. To reduce noise, prior solutions focused on using higher quality (and more expensive) components.

Accordingly, there is needed an oscillator (and method) having low noise.

SUMMARY

In accordance with one embodiment, there is provided a an oscillator including a resonator generating a resonating signal at a first frequency. A pulse generator receives the resonating signal and is operable for generating a pulsed signal at a second frequency responsive to the resonating signal and a level detection signal, the pulsed signal including one or more pulses for exciting the resonator, and wherein the pulsed signal and the resonating signal form an oscillation signal at the first frequency. The oscillator includes a level detector for receiving the oscillation signal and generating a level detection signal indicative of a signal level of the resonating signal.

In accordance with another embodiment, there is provided a low noise oscillator having a resonator generating and outputting a resonating signal at a first frequency on a resonating terminal. The oscillator further includes a frequency divider circuit coupled to the resonating terminal for generating a first signal at a second frequency equal to 1/N times the first frequency, and a phase shifting circuit coupled to the frequency divider circuit for phase shifting the first signal by a phase shift amount to generate a phase shifted signal. A pulse generator coupled to the phase shifting circuit is operable for receiving the phase shifted signal and generating a pulsed signal at the second frequency, the pulsed signal including a plurality of pulses for exciting the resonator, and wherein the resonating signal forms an oscillation signal at the first frequency. A level detector is coupled for receiving the oscillation signal and generating a level detection signal indicative of a signal level of the resonating signal.

In yet another embodiment, there is provided a method of generating an oscillation signal. The method includes generating a resonating signal at a first frequency; generating a resonating level detection signal in response to detecting a level of the resonating signal; generating a pulsed signal at a second frequency responsive to the resonating signal and the resonating level detection signal, wherein one or more signal characteristics of the pulsed signal is based on the resonating level detection signal; and applying the pulsed signal to the resonator.

Other technical features may be readily apparent to one skilled in the art from the following figures, descriptions, and claims.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 4 is a block diagram of an alternative embodiment of a low noise oscillator in accordance with the present disclosure;

FIG. 5 is a block diagram of another embodiment of a low noise oscillator;

DETAILED DESCRIPTION

Figure 1:
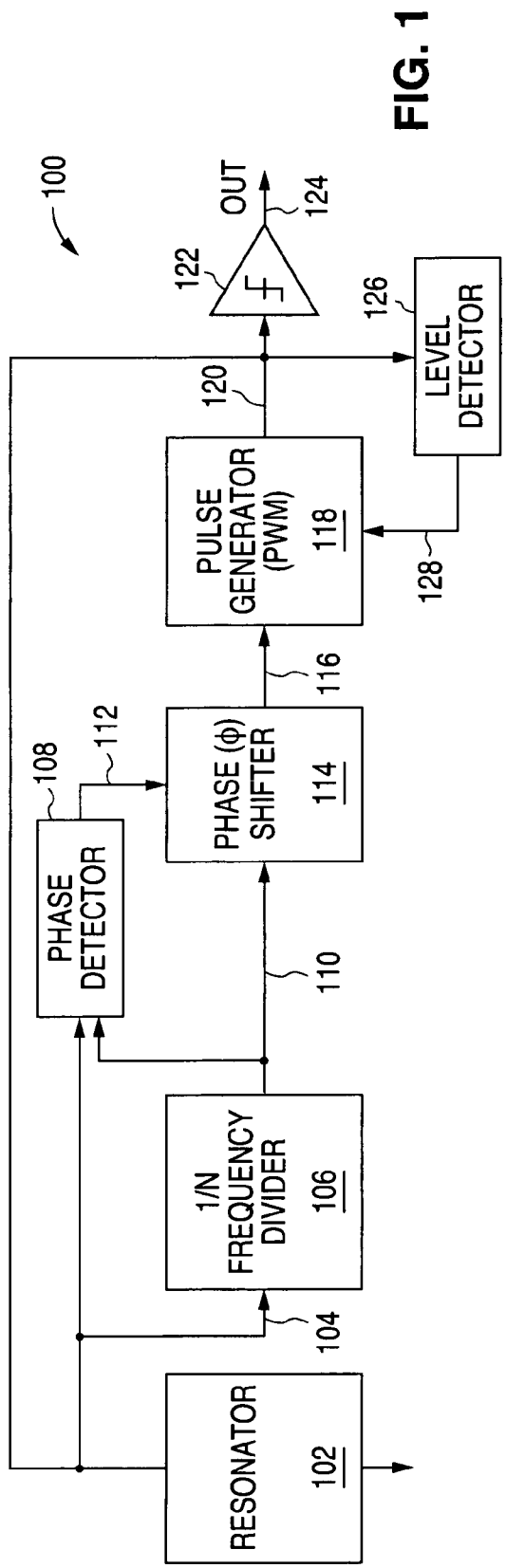
FIG. 1 is a block diagram of a low noise oscillator in accordance with the present disclosure.

FIG. 1 illustrates one embodiment of a low noise oscillator 100 in accordance with the present disclosure. The oscillator 100 includes a resonator (or resonator circuit) 102 that generates and outputs a resonator signal 104. The resonation frequency depends on the physical characteristics of the resonator (e.g., type of resonator, values of components, etc.). It will be understood that any suitable resonator may be utilized, including series or parallel inductor and capacitor, crystal, surface acoustic wave (SAW) and microelectromechanical system (MEMS). In one embodiment, the resonator 102 has a Q factor sufficient to generate the resonating signal 104 for several cycles at the desired frequency before the signal drops below a given level.

The resonator output signal 104 is input to a 1/N frequency divider 106 that divides the frequency by N and generates a frequency divided output signal 110 (at 1/N times the resonator frequency). In one embodiment, N has a value greater than 1. In another embodiment, N is an integer equal to or greater than 2. The resonator signal 104 is also input to a phase detector 108 which outputs a phase detection signal 112.

Outputs of the frequency divider 106 and the phase detector 108 are input to a phase ($\Phi$) shifter 114 that shifts the phase of the frequency divided output signal 110. The phase shifted signal 116 is input to a pulse generator 118 which generates and outputs pulses (pulsed signal 120) having one or more operating parameters (e.g., pulse width, pulse amplitude) based on the energy lost in the resonator circuit 102. The parameter(s) is based on the level of the resonator signal 104 output from the resonator 102. In general terms, pulse width or amplitude is increased as the magnitude of the resonating signal 104 decreases (and vice versa). At some point in time, a steady state is reached. It will be understood that the pulse generator 118 may generate voltage or current pulses.

The phase detector 108 controls the time alignment of the pulse 120 relative to the resonator output signal 104. The phase shifter time aligns (phase shifts) the output pulse of the frequency divider 106 such that the rising edge of the pulse 120 corresponds with a peak of the resonator signal 104. Pulse alignment is utilized so that the only introduced effect to replacing energy lost in the resonator 102 is amplitude modulation, not phase modulation. When the pulse is pulsed at a point where the first derivative of the wave is zero, only amplitude modulation occurs and only the amplitude of the wave is changed—no phase changes. For a sinusoid, those points are at the high and low levels. It will be understood that the phase shifter 114 may be implemented or constructed using any suitable components, and may be implemented using a vector modulator or a time delay circuit.

The pulsed signal 120 is input to the resonator 102 to provide a "pinging" pulse of energy to the resonator (i.e., an impulse). Each pulse (or ping) 120 causes the resonator 102 to "ring" for more than one (sinusoidal) cycle at the desired frequency. The "ringing" is sensed by the frequency divider 106 and provides an output (or change in output value) every N cycles of the resonator signal.

The pulsed output 120 from the pulse generator 118 is input to a limiter circuit 122 that generates an oscillation output signal 124. The circuit 122 may be constructed as a limiting amplifier or otherwise functions to detect zero (or other predetermined threshold) crossings. In one embodiment, the oscillation output signal 124 is in the form of a square wave having high and low voltage levels with a frequency equal to the resonating frequency. In another embodiment, the output of the limiter circuit 122 is additionally filtered (not shown) to generate a sinusoidal waveform output from the oscillator 100.

The resonating signal 104 (with any pulses superimposed thereon from the pulse generator 118) is applied to a level detector 126. The detector 126 generates a feedback or control signal to the pulse generator 118 for adjusting or controlling parameter(s) of the pulse. The level detector 126 functions to detect the level (voltage, current, or energy) of the resonating signal, such as by detecting its envelope. An optional filter may be included for filtering high frequencies (e.g., resonant frequency and pulses). It will be understood that the resonator 102 input terminal and output terminal for the oscillator 100 illustrated in FIG. 1 is the same terminal. Other resonator configurations may have an input terminal (that receives application of the pulsed signal 120) separate from the output terminal (that generates the resonating signal 104).

In one embodiment, the pulse amplitude, width (or both) may be further controlled, such as during an initial startup and ramp down mode, using additional circuitry (not shown). In one example, the oscillator 100 may start with a pulse width having a 50% duty cycle with a reduction or ramp down in succeeding pulse widths until reaching a pulse width level that achieves or maintains a relatively steady state oscillation.

In the embodiment shown in FIG. 1, the pulse generator 118 is implemented as a pulse width modulator (PWM) circuit (i.e., pulse generator having pulse width control). The PWM 118 modulates or adjusts the pulse width depending on the detected level of the resonating signal 104. If the level is below or above a predetermined threshold at the time of sampling (at 1/N times resonating frequency), the pulse width is adjusted to increase or decrease the amount of energy applied by the pulse to the resonator 102. At some point, a relatively steady state should be reached.

Figure 2:
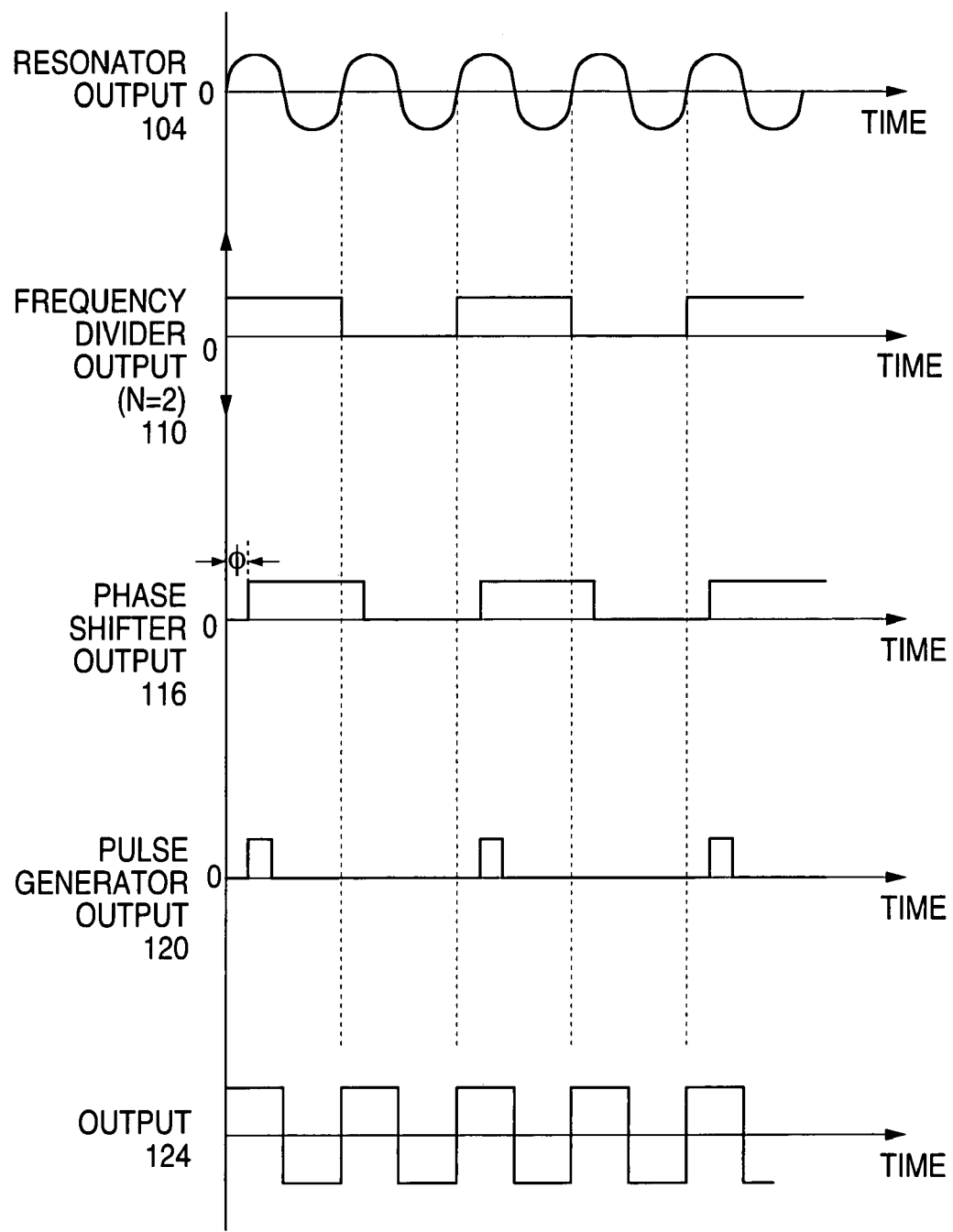
FIG. 2 is a diagram illustrating signal waveforms at various points within the low noise oscillator shown in FIG. 1.

With reference to FIG. 2, there are illustrated various signal waveforms for the resonator signal 104, frequency divided signal 110, phase shifted signal 116, pulsed signal 120 and oscillation output signal 124.

Figure 3:
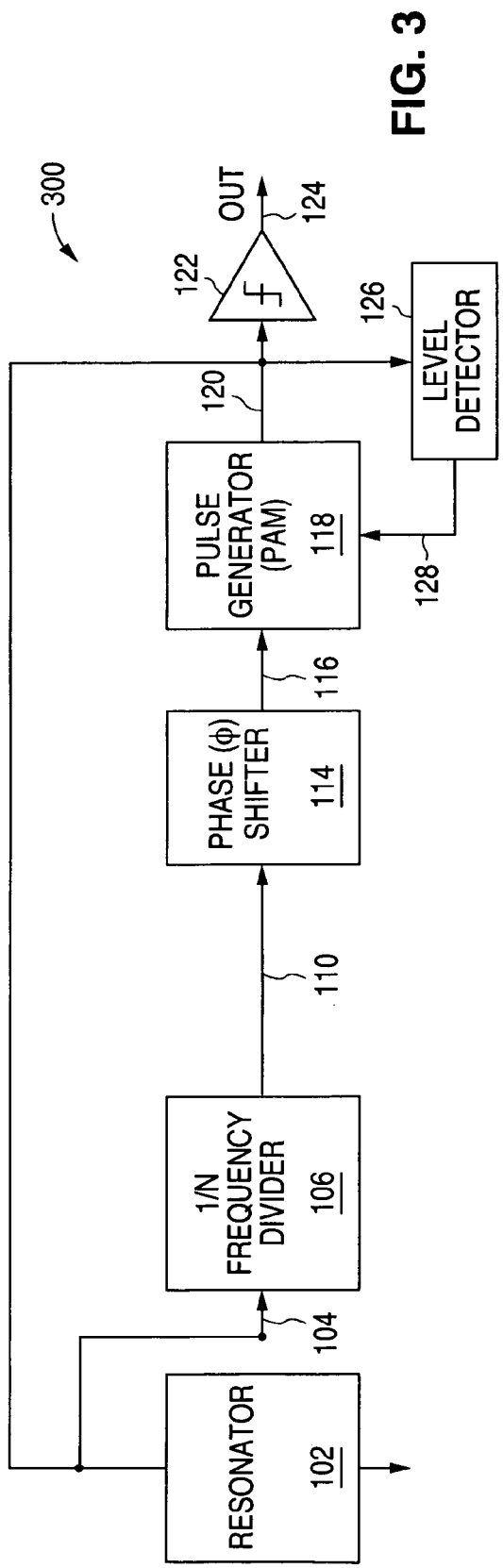
FIG. 3 is a block diagram of another embodiment of the low noise oscillator shown in FIG. 1.

Now referring to FIG. 3, there is illustrated another embodiment of an oscillator 300 in accordance with the present disclosure. In this embodiment, the pulse generator 118 is implemented as a pulse amplitude modulator (PAM) circuit (i.e., pulse generator having pulse amplitude control) with the pulse width being preset. Pulse amplitude is detected and controlled using the feedback or control signal from the level detector 126.

Generally for embodiments described herein, the resonator 102 is excited with a pulsed signal (i.e., an impulse of energy) to replace energy lost to parasitic resistive losses at a frequency less than the resonant frequency. In one embodiment, the pulsed signal has a frequency equal to 1/N times the resonant frequency, where N is an integer (N=1, 2, 3 . . . ). In another embodiment, N is an integer greater than or equal to 2. Prior art oscillators generated exciting pulses every ½ or whole period of the oscillating period. In this manner, the pulse generator 118 provides a pulse output every N cycles of the resonation frequency.

The oscillator 100 includes controlling circuits that determine when the oscillator 100 actually needs an impulse to recoup losses resulting from operation (due to its physical and operational characteristics) of the resonator 102. In addition, controlling the length of time an energy pulse is applied to the resonator 102 provides a mechanism to control loop gain of the oscillator 100. This allows for fine tuning of the loop gain without relying on excess loop gain designed into the oscillator for startup or necessary to maintain accuracy or margins. The oscillator embodiments described herein provide benefits that permit construction of higher quality oscillators, particularly integrated oscillators and/or clocks for digital/optical systems, with lower noise. This further may allow for co-integration of a local oscillator (previously almost exclusively provided off-chip) with most or all of its components onto an integrated circuit.

As noted, when the Q factor is large enough, the resonator 102 generates several cycles of the output signal before the signal drops below a given threshold level. The actual amplitude envelope reduction (resulting from Q) and the threshold level determine the number of cycles that will occur before the resonator needs to be pulsed (excited). It will be understood that in one embodiment, N is related to Q of the resonator 102. Higher Q would allow for more cycles which means a higher N if all other parameters remained that same. However, N may be independent from Q such as by adjustment of the threshold level for the level detector.

As will be appreciated, the oscillator embodiments herein may be implemented using digital circuits except for the resonator 102 (and possibly the level detector 126 and filter). As a result, the only frequency determining component is the resonator 102. Reducing the number of frequency determining components leads to a reduction in circuit induced modulation or noise. It will also be understood that the value of N may be changed (statically or dynamically) to permit utilization of high quality resonators. This reduces power and noise, and further allows for the use of lower frequency digital components. It will also be understood that the resonator 102 may be implemented as a quadrature resonator having two output signals separated by 90 degrees or one-quarter period.

In another embodiment, once the resonator 102 has been "pinged" or pulsed (e.g. excitation), the resonator 102 may be decoupled or disconnected from the other active components/circuits. A mechanical, electrical or other type of switch component or circuit may be used. Any implementation or structure that provides a switching or decoupling function is contemplated for use herein. For example, a MEMS switch may be utilized. Switching or decoupling of the active circuitry from the resonator input may reduce thermal noise contributed by the active circuitry.

Now referring to FIG. 4, there is illustrated a block diagram of an alternative oscillator circuit 400. The oscillator 400 includes the resonator 102 generating and outputting the resonating signal 104 to a limiter circuit 402. The limiter circuit 402 converts the sinusoidal resonating signal waveform into a square wave signal 404 having the same frequency. The output signal 404 is applied to one input of a two-input AND gate 406 having its output 408 input to the pulse generator 118. The pulse generator 118 produces a pulsed output signal 410 that is input to the limiter circuit 122 and also fed back to the resonator 102 (similar to the configuration of FIG. 1). It will be understood that, the gate 406 may include other digital logic gates or functionality, as needed depending on the design).

The resonating signal 104 (with any pulses superimposed thereon from the pulse generator 118) is applied to a level detector 412. The level detector 412 functions to detect the level (voltage, current, or energy) of the resonating signal, such as by detecting its envelope. The detector 412 outputs a signal when the level of the resonating signal 104 level falls below a predetermined value. This output signal is input to another limiter circuit 414 to generate an "enable" signal 416. The enable signal 416 is applied to the other input of the two-input AND gate 406 and provides a gating function for the square wave signal 404.

In general terms, when the level of the resonating signal falls below the predetermined value, the enable signal 416 is activated (logic high/low) and when the square wave signal 404 is logic high/low, the output of the AND gate 408 is high/low as required. The pulse generator 118 responds by generating and applying the pulse signal 410 to the resonator 102. Upon excitation, the magnitude of the resonating signal 104 increases to a level above the threshold and the enable signal 416 deactivates until the resonator signal level subsequently falls below the predetermined threshold value. Similar to the oscillators shown in FIGS. 1 and 3, excitation pulses having a frequency less than the resonant frequency (e.g., 1/N, where N=1, 2, 3 . . . ) are generated and applied to the resonator 104 when the magnitude of the resonant signal falls below a predetermined value.

Oscillator 400 is similar in configuration to those shown and described above (FIGS. 1, 3); however, the 1/N frequency divider circuit 106, phase detector 108 and phase shifter circuit 114 have been omitted. The enable signal 416 and the square wave output signal 404 (at the resonant frequency) are applied as inputs to the AND gate 406 and the output tracks the square wave output signal 404 only when the enable signal 416 is active. The AND gate generates an output signal only when the resonator signal 104 is above a desired threshold level. When the resonating signal 104 falls below the threshold level, the enable signal 416 becomes active initiating the pulse generator 118 to output a pulse.

Now referring to FIG. 5, there is illustrated a block diagram of another oscillator circuit 500. The oscillator 500 includes the resonator 102 generating and outputting the resonating signal 104 to a limiter circuit 502. The limiter circuit 502 converts the sinusoidal resonating signal waveform into a square wave signal 404 at the same frequency. The output signal 504 is applied to one input of a two-input AND gate 506 having its output 508 input to the pulse generator 118. The pulse generator 118 produces a pulsed output signal 510 that is input to the limiter circuit 122 and also fed back to the resonator 102 (similar to the configuration of FIG. 1).

The resonating signal 104 is also processed by 1/N counter circuit 512 which counts the number N of cycles. Every N counts, the counter circuit 512 generates an "enable" signal 514. The enable signal 514 is applied to the other input of the two-input AND gate 506. With knowledge of the value of Q for the resonator 102 (or other spectral needs), the counter can be preset to count the number of cycles of the resonating signal. When N is reached, the enable signal 514 is activated. As compared to the oscillator 400 shown in FIG. 4, this configuration eliminates the need for level control circuitry.

The enable signal 514 and the output signal 504 (at the resonant frequency) are applied as inputs to the AND gate 506 and the output tracks the output signal 504 only every N times (when the count reaches N). This is similar in function to a 1/N frequency divider, but no phase detection or phase shift is necessary.

Figure 6:
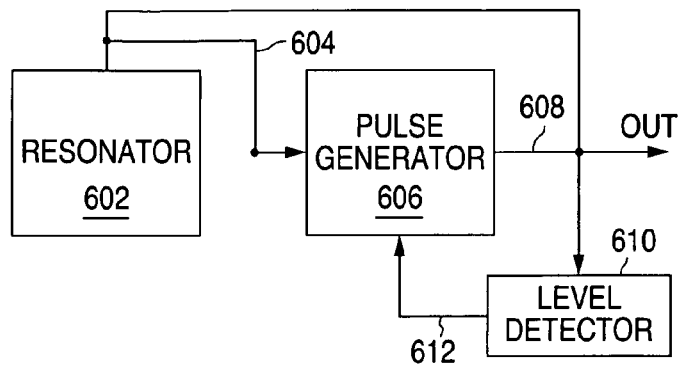
FIG. 6 is a block diagram of a basic oscillator circuit in accordance with the present disclosure.

Now referring to FIG. 6, there is illustrated an overall block diagram of an oscillator 600 generating a pulse at the resonant frequency (i.e., where N=1). The oscillator 600 includes a resonator (or resonator circuit) 602 that generates and outputs a resonator signal 604. The resonator output signal 604 is input to a pulse generator 606 which generates and outputs pulses (pulsed signal 608) having one or more operating parameters (e.g., pulse width, pulse amplitude) based on the energy lost in the resonator circuit 602.

The resonating signal 604 (and the superimposed pulsed signal 608) is input to a level detector 610. The detector 610 detects pulse amplitude, pulse width or both and generates a control or feedback signal 612 to the pulse generator 606 for adjusting or controlling parameter(s) of the pulse (e.g., pulse amplitude, pulse width). The resonator 602 receives pulses every cycle but only by an amount (pulse width, pulse amplitude, or both) needed to maintain oscillation. This is advantageous in low power applications as these pulses may include small amounts of energy. The resonator 602, pulse generator 606 and level detector 610 may be the same or have similar functionality as the resonator 102, pulse generator 118 and level detector 126 described above.

Figure 7:
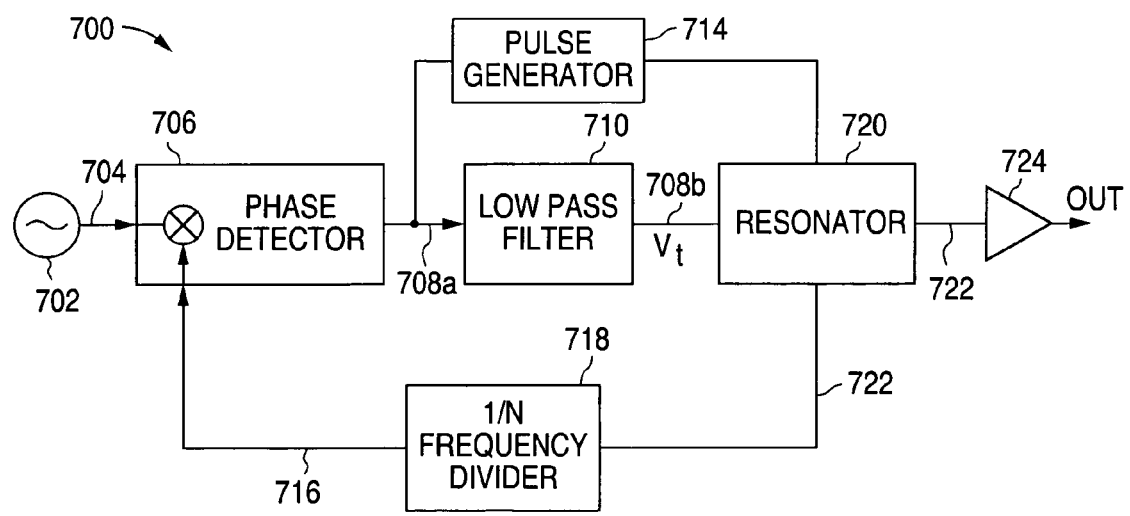
FIG. 7 illustrates a phase locked loop (PLL) in accordance with the present disclosure.

Now referring to FIG. 7, there is shown a block diagram of one embodiment of a phase lock loop (PLL) 700 including a reference signal source 702 operating in combination with a tunable "pinged" resonator 720. The source 702 outputs a stable reference signal 704 having frequency Fref. The tunable "pinged" resonator 720 outputs a resonating signal 722 having an output frequency Fout=N*Fref. The resonating signal 722 is input to a buffer or limiter circuit 724 to generate an oscillation signal at Fout.

The resonating signal 722 is input to a 1/N divider circuit 718 generating a 1/N resonating signal 716 for input to a phase detector 706. The phase detector 706 compares the phase of the 1/N resonating signal 716 to the phase of the reference signal 704 and outputs a phase detection signal 708a. The phase detector 706 and a low pass filter 710 operate in conjunction to generate a tuning voltage (Vt) 708b for input to the resonator 720. The Vt signal adjusts the resonant frequency (Fout) of the resonator 720 to ensure it is tuned to N*Fref. The output signal 708a is also input to a pulse generator 714 that generates pulses to excite or "ping" the resonator 720 to generate the resonating signal 722.

The PLL 700 provides increased control of output frequency as well as allows shaping of the phase noise profile of the output waveform.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An oscillator comprising:
a resonator generating a resonating signal at a first frequency;
a pulse generator receiving the resonating signal and operable for generating a pulsed signal at a second frequency responsive to the resonating signal and a level detection signal, the pulsed signal including one or more pulses for exciting the resonator, and wherein the pulsed signal and the resonating signal form an oscillation signal at the first frequency, wherein the second frequency is equal to 1/N times the first frequency, where N equals an integer greater than one; and
a level detector receiving the oscillation signal and generating a level detection signal indicative of a signal level of the resonating signal.

2. An oscillator in accordance with claim 1 wherein each of the one or more pulses of the pulsed signal is generated when the signal level of the resonating signal falls below a predetermined value.

3. An oscillator in accordance with claim 2 wherein the one or more pulses is adjusted in response to the detected level of the resonating signal.

4. An oscillator in accordance with claim 3 wherein pulse amplitude is adjusted.

5. An oscillator in accordance with claim 3 wherein pulse width is adjusted.

6. A low noise oscillator comprising:
a resonator generating and outputting a resonating signal at a first frequency on a resonating terminal;
a frequency divider circuit coupled to the resonating terminal for generating a first signal at a second frequency equal to 1/N times the first frequency;
a phase shifting circuit coupled to the frequency divider circuit for phase shifting the first signal by a phase shift amount to generate a phase shifted signal;
a pulse generator coupled to the phase shifting circuit operable for receiving the phase shifted signal and generating a pulsed signal at the second frequency, the pulsed signal including a plurality of pulses for exciting the resonator, and wherein the resonating signal forms an oscillation signal at the first frequency; and
a level detector coupled for receiving the oscillation signal and generating a level detection signal indicative of a signal level of the resonating signal.

7. An oscillator in accordance with claim 6 wherein the pulse generator comprises a pulse width modulator (PWM) circuit operable for adjusting a pulse width of the plurality of pulses in the pulsed signal.

8. An oscillator in accordance with claim 6 wherein the pulse generator comprises a pulse amplitude modulator (PAM) circuit operable for adjusting amplitude of the plurality of pulses in the pulsed signal.

9. An oscillator in accordance with claim 6 wherein the resonator has a Q factor and N depends on the Q factor.

10. An oscillator in accordance with claim 6 wherein each of the plurality of pulses is generated when the signal level of the resonating signal falls below a predetermined value.

11. An oscillator in accordance with claim 6 wherein one or more of the plurality of pulses are adjusted in response to the detected level of the resonating signal.

12. An oscillator in accordance with claim 6 wherein the phase shifting circuit operably time aligns the plurality of pulses with the resonating signal.

13. A method of generating an oscillation signal, the method comprising:
generating a resonating signal at a first frequency;
generating a resonating level detection signal in response to detecting a level of the resonating signal;
generating a pulsed signal at a second frequency responsive to the resonating signal and the resonating level detection signal, wherein one or more signal characteristics of the pulsed signal is based on the resonating level detection signal;
generating pulses within the pulsed signal at the second frequency equal to 1/N times the first frequency, where N is an integer equal to or greater than 1; and
applying the pulsed signal to the resonator.

14. A method in accordance with claim 13 further comprising:
adjusting width of a pulse in the pulsed signal.

15. A method in accordance with claim 13 further comprising:
adjusting amplitude of a pulse in the pulsed signal.

16. An oscillator comprising:
a resonator generating a resonating signal at a first frequency;
a pulse generator receiving the resonating signal and operable for generating a pulsed signal at a second frequency responsive to the resonating signal and a level detection signal, the pulsed signal including one or more pulses for exciting the resonator, and wherein the pulsed signal and the resonating signal form an oscillation signal at the first frequency;
a level detector receiving the oscillation signal and generating a level detection signal indicative of a signal level of the resonating signal;
wherein each of the one or more pulses of the pulsed signal is generated when the signal level of the resonating signal falls below a predetermined value and the one or more pulses is adjusted in response to the detected level of the resonating signal; and
wherein pulse width is adjusted.

17. An oscillator in accordance with claim 16 wherein the second frequency is equal to 1/N times the first frequency, where N equals an integer greater than one.

18. An oscillator in accordance with claim 16 wherein the first frequency equals the second frequency.

19. An oscillator in accordance with claim 16 wherein pulse amplitude is adjusted.

20. A method of generating an oscillation signal, the method comprising:
generating a resonating signal at a first frequency;
generating a resonating level detection signal in response to detecting a level of the resonating signal;
generating a pulsed signal at a second frequency responsive to the resonating signal and the resonating level detection signal, wherein one or more signal characteristics of the pulsed signal is based on the resonating level detection signal;
adjusting width of a pulse in the pulsed signal; and
applying the pulsed signal to the resonator.

21. A method in accordance with claim 20 wherein generating a pulsed signal at a second frequency further comprises:

generating pulses within the pulsed signal at the second frequency equal to 1/N times the first frequency, where N is an integer equal to or greater than 1.

22. A method in accordance with claim 20 wherein the first frequency equals the second frequency.

23. A method of generating an oscillation signal, the method comprising:
    generating a resonating signal at a first frequency;
    generating a resonating level detection signal in response to detecting a level of the resonating signal;
    generating a pulsed signal at a second frequency responsive to the resonating signal and the resonating level detection signal, wherein one or more signal characteristics of the pulsed signal is based on the resonating level detection signal;
    adjusting amplitude of a pulse in the pulsed signal; and
    applying the pulsed signal to the resonator.

24. A method in accordance with claim 23 wherein generating a pulsed signal at a second frequency further comprises:
    generating pulses within the pulsed signal at the second frequency equal to 1/N times the first frequency, where N is an integer equal to or greater than 1.

25. A method in accordance with claim 23 wherein the first frequency equals the second frequency.

* * * * *